United States Patent [19]

Hanke et al.

[11] Patent Number: 4,965,433
[45] Date of Patent: Oct. 23, 1990

[54] VACUUM PICKUP TOOL WITH INTEGRALLY HEATED SOLDERING TIP

[75] Inventors: Kurt F. Hanke; Wesley C. Lund, both of Seattle; David F. Feider, Renton, all of Wash.

[73] Assignee: The Boeing Company, Seattle, Wash.

[21] Appl. No.: 281,985

[22] Filed: Dec. 9, 1988

[51] Int. Cl.⁵ .............................................. H05B 3/00
[52] U.S. Cl. ..................... 219/230; 219/235
[58] Field of Search ............. 219/230, 236, 229, 233, 219/235; 228/7

[56] References Cited

U.S. PATENT DOCUMENTS

| | | | |
|---|---|---|---|
| 3,568,307 | 3/1971 | Zanger et al. | 29/589 |
| 3,641,648 | 2/1972 | Kalberman | 29/203 B |
| 3,911,246 | 10/1975 | Drinkard, Jr. | 219/234 |
| 4,206,864 | 6/1980 | Rauchwerger | 219/230 |
| 4,435,636 | 3/1984 | Royston | 219/230 |
| 4,528,746 | 7/1985 | Yoshimura | 29/743 |
| 4,591,696 | 5/1986 | Eisen | 219/235 |
| 4,607,151 | 8/1986 | Kihlstrom | 219/230 |
| 4,659,004 | 4/1987 | Fridman | 228/6.2 |

Primary Examiner—Roy N. Envall, Jr.
Attorney, Agent, or Firm—Christensen, O'Connor, Johnson & Kindness

[57] ABSTRACT

A vacuum pickup tool (10) having a handle (16) and a barrel (22) mounted thereto with a tip (24) that is heated by a temperature control unit (114). The barrel (22) and tip (24) include a longitudinal axial bore (41) attached to an air source through connector (116) to provide vacuum through an axial opening (62) and the tip (24) to hold a Z-clip (74) to the barrel (22). Actuation of a trigger (28) deactivates the vacuum and simultaneously heats the tip (24) to solder the clip (74) onto a wire wrapped pin (64) inserted through a circuit board (66). A thermocouple (54) and controller 114 monitor and control the temperature of the tip (24) as preset by the temperature control (114) on an instrument assembly (96).

16 Claims, 5 Drawing Sheets

VACUUM PICKUP TOOL WITH INTEGRALLY HEATED SOLDERING TIP

TECHNICAL FIELD

The present invention relates to installation tools for electronic components, and, more particularly, to a hand-held, vacuum-assisted pickup tool having an integral soldering tip.

BACKGROUND OF THE INVENTION

Electronic components, and, more particularly, integrated circuits, are typically attached to circuit boards by plugging them into sockets that are bonded to the board. One method for bonding the sockets to the board is to use the wire-wrap method. On wire-wrap circuit boards, the socket has wire-wrap pins that extend through holes in the board and protrude out the other side. These pins have a square-shaped cross section and are eventually wrapped with electrically conductive wire. The wire is strung between the pins to connect them electrically and thus form circuits. Prior to the wire-wrap operation, a connector clip, such as the well-known "Z" clips (manufactured by the Zero Corporation, located in Burbank, California), are pushed down over selected pins, seated against the circuit board, and soldered to a ground strip or power strip which is integrally formed on the board's surface to create a conductive path to power or ground.

Although this method has served its purpose, it has several disadvantages. First, a substantial amount of manual labor at great expense is required to assemble the electronic components on a circuit board. In addition, hand soldering is not as reliable as automated soldering because operator technique can vary, and without proper heat control a soldered joint will easily fail. Finally, the number of manual steps required to solder each pin makes the process very slow, rendering the hand construction method incompatible with the faster automated manufacturing processes.

SUMMARY OF THE INVENTION

The foregoing and other disadvantages are overcome in the present invention wherein a vacuum pickup tool with an integral soldering tip for picking up and soldering a connector clip to a wire-wrap pin is provided. The tool comprises a body that includes a handle portion, a barrel having a mounting end mounted to the body and a protruding end protruding from the body, and a tip on the protruding end of the barrel. A longitudinal axial bore is formed in the barrel that opens to both the mounting end and the protruding end, with an air source being coupled to the opening in the mounting end. A first opening in the tip is connected to the opening in the protruding end of the barrel and a second opening in the tip communicates with the first opening such that a vacuum applied by the air source at the barrel creates a vacuum or suction at the second opening. With this configuration, a connector clip placed over the second opening will be held in place on the tip by means of the applied vacuum. In addition, the second opening in the tip is sized and shaped to receive the wire-wrap pin as the connector clip is placed over the pin to thereby align the tip and connector clip with the pin. Finally, means for heating the tip in the form of an electrically resistive heating element formed in the tip effects soldering of the connector clip to the pin.

In accordance with another aspect of the invention, the electrically resistive heating element is selectively activated by a switch in the handle that simultaneously deactivates the air source. The heating element is maintained at the proper temperature by means of a thermocouple attached to the tip and a temperature controller mounted to an instrument assembly.

In accordance with yet another aspect of the present invention, the tip has an outwardly projecting step for supporting a Z-shaped connector clip.

As will be readily appreciated from the foregoing description, with this tool the connector clip can be picked up and held in the proper position for rapid installation on a wire-wrap pin. The clip is held on the tool in a manner that allows alignment with the proper pin. The invention also provides proper heat control for soldering the clip to the pin. Thus, in one motion the clip is placed over and soldered to the pin as compared to first placing the clip on the pin with tweezers or pliers and then soldering the two together with an iron. The present invention is usable in both a manual mode and in conjunction with a programmed numerical control machine.

BRIEF DESCRIPTION OF THE DRAWINGS

The foregoing and other advantages and features of the present invention will be better understood from the following description of the preferred embodiment of the invention when taken in conjunction with the following drawings, wherein.

DETAILED DESCRIPTION OF THE PREFERRED EMBODIMENT

Figure 1:
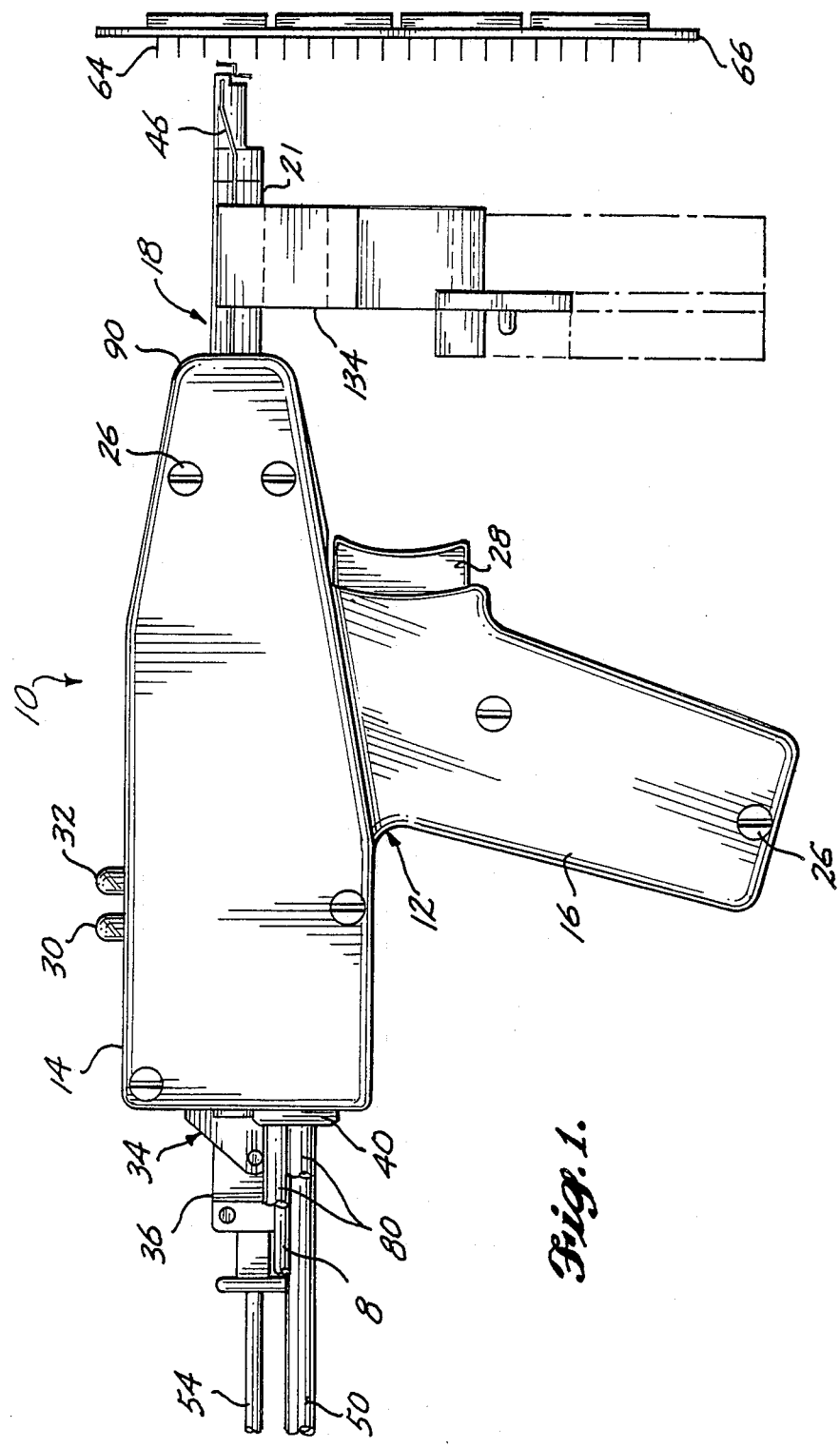
FIG. 1 is a side elevation view of the vacuum pickup tool with integrally heated soldering tip formed in accordance with the present invention.
Figure 2:
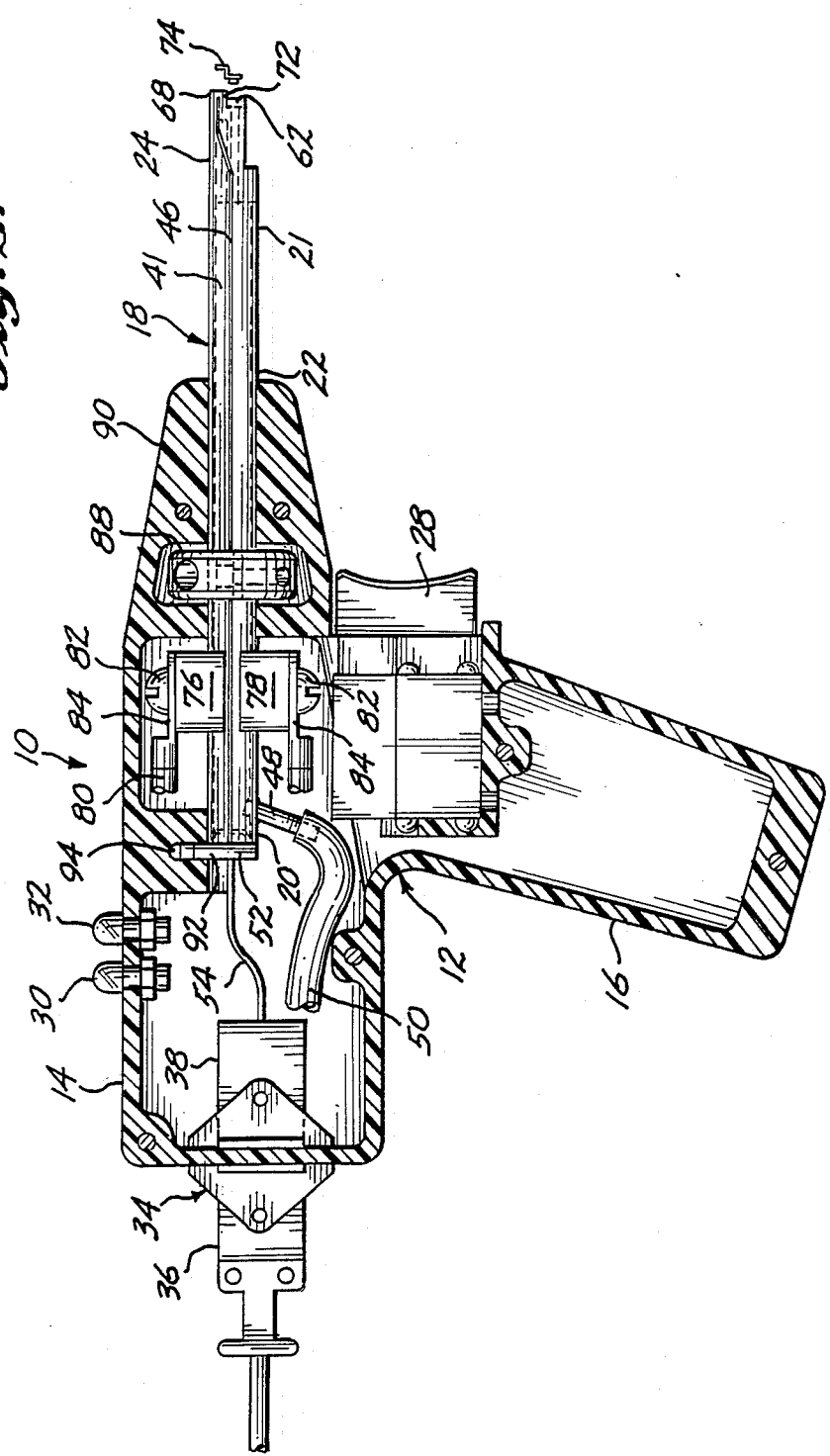
FIG. 2 is a side cross-sectional view of the tool depicted in FIG. 1.

Referring initially to FIGS. 1 and 2, the hand-held vacuum pickup tool 10 comprises a body 12, that includes a central portion 14 and a handle portion 16, and a barrel assembly 18 having a barrel 22 with a mounting end 20 and a protruding end 21, and a tip 24. Mounted to the top of the body 12 are two indicator lights, a temperature alarm light 30 and a power-on light 32. On the back of the body 12 is a thermocoupled connector assembly 34 and a grommet 40 through which various wires and tubing pass as will be described more fully below. The thermocoupled connector assembly 34 is comprised of a male connector 36 and a female connector 38. Enclosed within the body 12 is a major portion of the barrel 22 mounted within the central portion 14 and a switch in the form of a trigger 28 mounted in the handle portion 16. Ideally, the body 12 is formed of left and right halves, preferably formed of high temperature plastic, that are held together by a plurality of fasteners 26.

Figure 3:
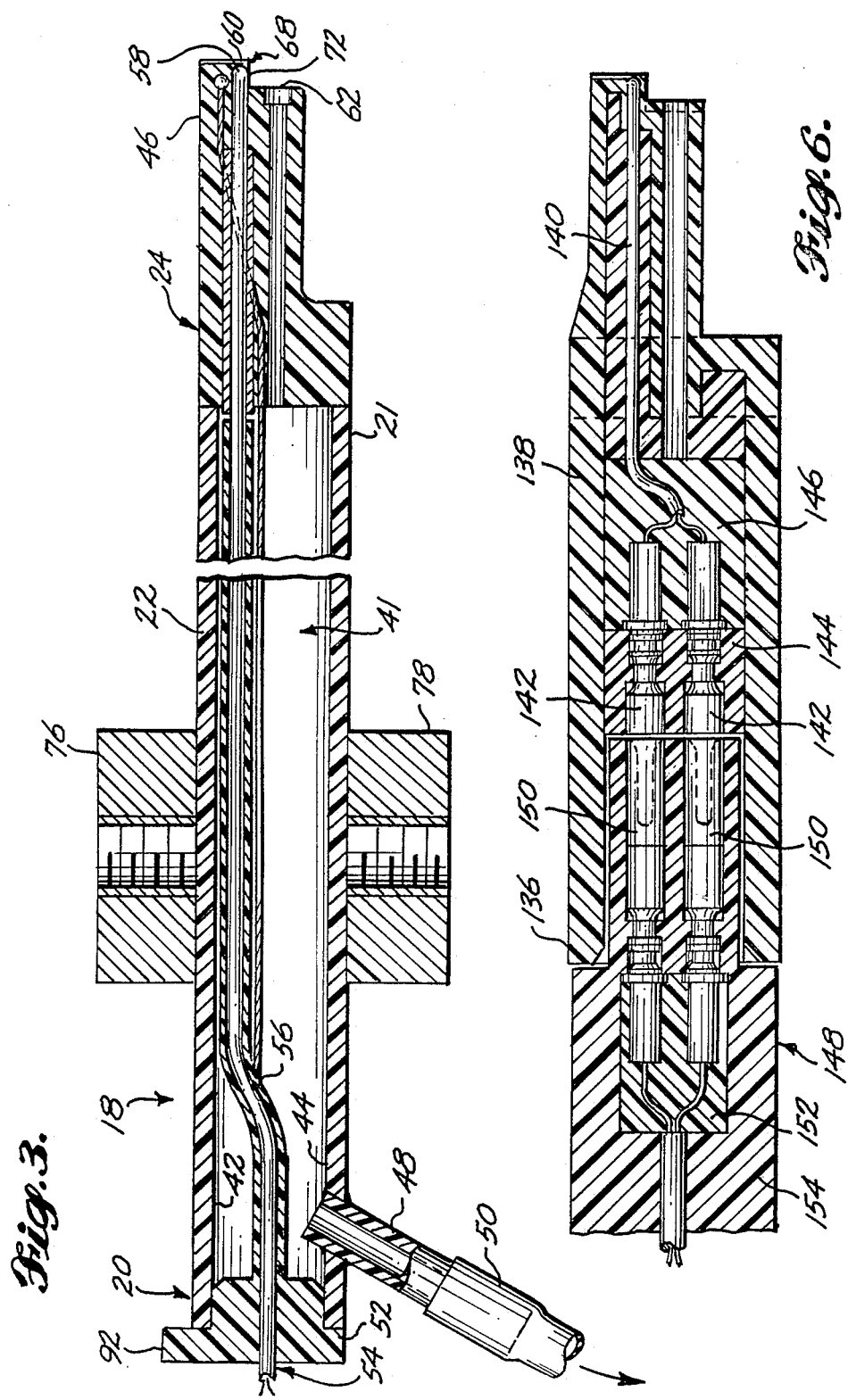
FIG. 3 is an enlarged cross-sectional view of the tip of the tool depicted in FIGS. 1 and 2.

The barrel assembly 18, shown in greater detail in FIG. 3, includes a hollow brass barrel 22 having a longitudinal axial bore 41 that extends from the mounting end 20 to the protruding end 21 and through the tip 24. The barrel 22 is formed of a top barrel half 42 and a bottom barrel half 44 that are separated by an insulating sheet 46 formed of mica or other similar high temperature electrical insulating material. Protruding from the bottom barrel half 44 at the mounting end 20 is an air fitting or nipple 48 that is connected to a source of air by a flexible tubing 50. A plug 52 is inserted in the longitudinal bore 41 at the mounting end 20 of the barrel 22 and bonded in place to form an airtight seal. A sheathed thermocouple probe 54 passes through the plug 52, extends down the length of the barrel 22 and terminates inside the end of the tip 24. A high temperature electrical insulating sleeve encloses the sheathed thermocouple probe 54 throughout the length of the barrel 22 and partially through the tip 24. The exposed portion 58 of the thermocouple cable 54 in the tip 24 has a protective layer of electrically insulative material 60 to prevent the thermocouple cable from grounding against the barrel 22. However, the thermocouple probe is silver soldered to the tip 24 to accurately measure the temperature of the tip 24.

The tip 24 is preferably machined from high temperature resistance alloy, such as nickel-chrome, and is silver soldered to the other end of the barrel 22. An axial opening 62 in the tip 24 functions as a conduit for the passage of air both under negative and positive pressure, and it also functions as a clearance hole for the wire-wrap pins 64, illustrated in FIG. 1 as projecting through the circuit board 66. The insulating sheet 46 extends into the tip 24, terminating just prior to the projection 68. The projection 68 extends beyond the exposed opening of the axial hole 62 to form a step 72 that is sized to precisely fit the outline of a Z-clip 74.

An upper terminal 76 and a lower terminal 78 project from the top barrel half 42 and bottom barrel half 44, respectively, to provide attachment points for the electrical wires 80. As illustrated in FIG. 2, the wires 80 are attached to the terminals 76 and 78 by screws 82 inserted through terminal connectors 84 on each wire 80. The wires 80 exit the body 12 by passing through the grommet 40 as does the flexible tubing 50 and a cable 86 that includes the electrical wires for the trigger 28, the temperature alarm light 30 and the power-on light 32.

The barrel assembly 18 is mounted within the body 12 as shown in FIG. 2 such that a nose portion 90 on the body 12 securely clamps about the barrel 22 and a flange 92 on the plug 52 fits within a slot 94 in the interior of the body 12 to prevent the barrel 22 from sliding back and forth. A clamp collar 88 is fastened about the barrel 22 to hold the top and bottom barrel halves 42 and 44 securely together. The thermocouple cable 54 terminates at a female bulkhead connector 38 within the body 12. A male connector 36 connects to the female connector 38 to electrically connect the thermocouple to an instrument assembly 96.

Figure 4:
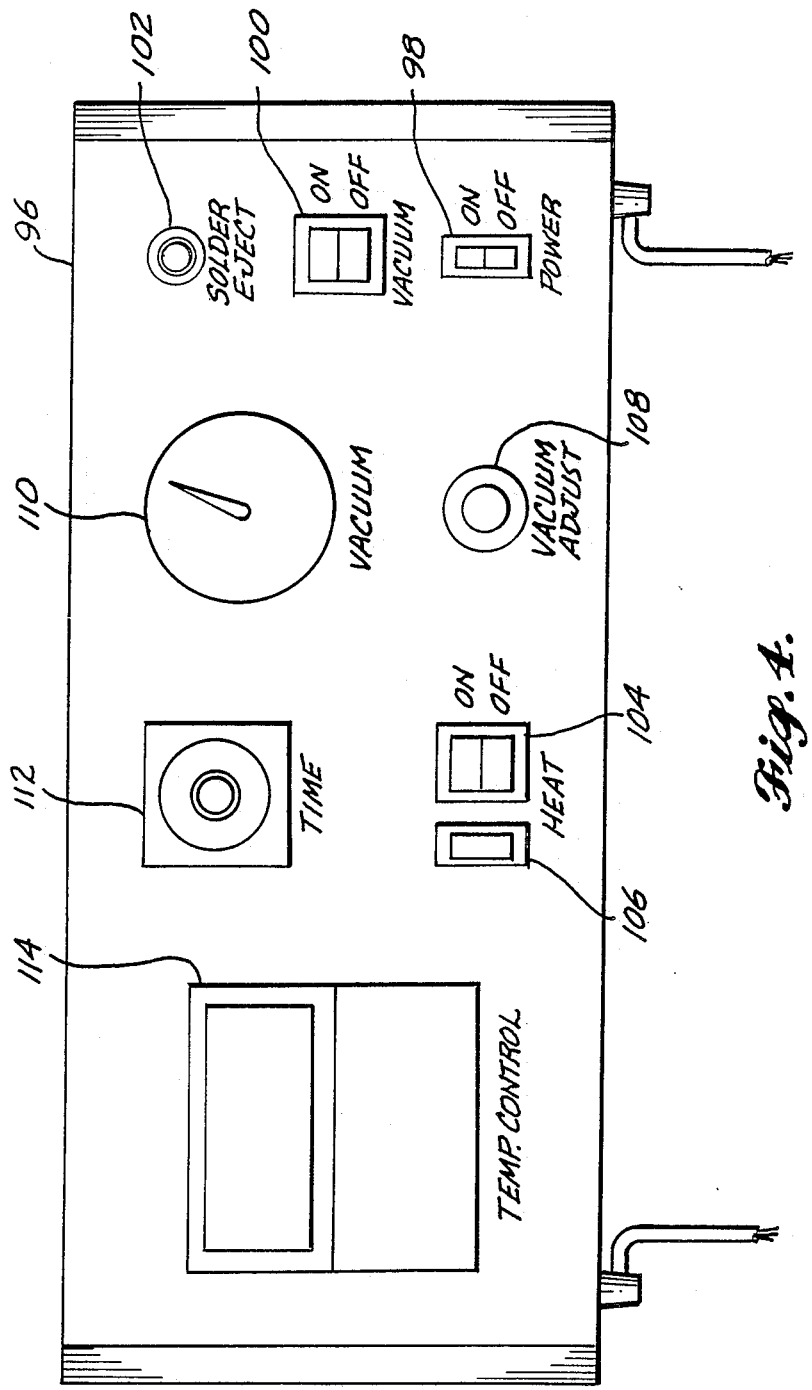
FIG. 4 is a side elevational illustration of an instrument control assembly used in conjunction with the vacuum pickup tool.

The instrument assembly 96 is a separate unit that houses the pneumatic and electric systems for the vacuum pickup tool 10. The representative embodiment of the instrument assembly 96 illustrated in FIG. 4 includes a power switch 98, a vacuum switch 100, a solder eject switch 102 and a heat switch 104 with an associated indicator light 106. In addition, a vacuum metering valve 108 and vacuum gauge 110 are used to control and monitor the application of air while a timer 112 and an indicating temperature control unit 114 control the application of heat.

Figure 5:
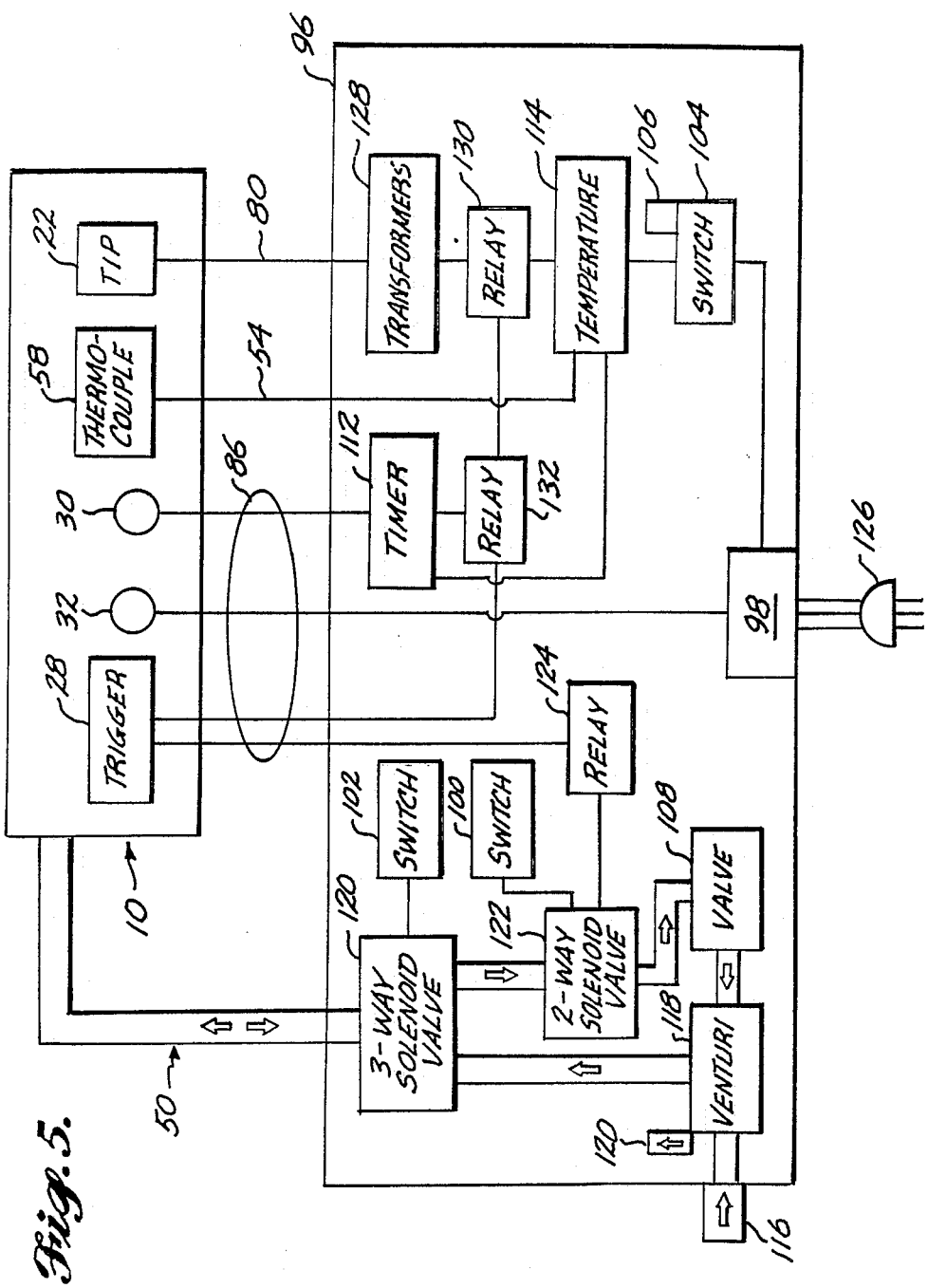
FIG. 5 is a simplified block diagram of the pneumatic and electrical systems for the vacuum pickup tool and instrument control assembly; and, FIG. 6 is a side cross-sectional view of an alternative embodiment of the tip of the vacuum pickup tool formed in accordance with the present invention.

FIG. 5 is a simplified diagram of the pneumatic and electrical control system housed in the instrument assembly 96. The pneumatic system is powered by a pressurized air source (not shown) providing air at a maximum 100 psi through a standard male quick disconnect fitting 116. Vacuum suction is provided by an eductor-type venturi 118 inside the instrument assembly 96. The eductor 118 has an exhaust silencer 120 attached to it to limit air noise. The vacuum provided by the eductor venturi 118 creates a suction of air through the longitudinal bore 41 in the barrel 22 and tip 24. A three-way solenoid valve 120, actuated by a momentary solder eject switch 102, temporarily overrides the suction of air through the tip 24 with a flow of positive pressure air for purposes of ejecting solder that may be accidentally sucked in through the opening 62 in the tip 24.

A two-way solenoid shut-off valve 122 controls the application of air pressure to the pneumatic system. The shut-off valve 122 is actuated by the vacuum switch 100. This switch 100 is overridden by the actuation of a relay 124 when the trigger 28 is pressed. The relay 124 temporarily closes the valve 122 to halt the suction of air through the tip 24 as solder is being melted. Release of the trigger 28 causes the relay 124 to return the valve 122 to the vacuum configuration. Adjustable flow controls on the three-way solenoid valve 120 are used to limit the maximum range of suction through the tip 24 and to limit the flow of positive air pressure to the tip 24 during solder ejection. The metering valve 108 is further used to adjust suction through the tip 24 within the range established by the flow control on the three-way solenoid valve 120.

Main power to the electric system is controlled by the power switch 98. Ideally, the power switch 98 is lighted to indicate that the system has been activated. Power to heat the tip 24 is provided by standard 110 volt current through the power plug 126 and a bank of six volt isolation transformers 128. The temperature controller 114 in conjunction with the thermocouple 54 provides temperature control for the tip 24 by interrupting power to the transformers 128. The heat switch 104 controls power to the temperature controller 114. A solid state relay 130 is located between the temperature controller 114 and the transformers 128 to protect the temperature controller 114 from excess current and to prolong the life of the contacts (not shown) in the temperature controller 114. The timer 112 is connected to the temperature alarm light 30 output from the temperature controller 114. The timer is activated when the controller 114 signals that a predetermined temperature has been reached. When the timer 112 times out, a latching relay 132 is set, which interrupts power to the solid state relay 130. This prevents heating of the tip 24 for longer than a predetermined time. This predetermined time is set according to the optimal temperature at which a soldered joint is to be soldered. The latching relay 132 is reset when the trigger 28 is released.

In operation, the instrument assembly and tool 10 are activated by turning on three switches, the power switch 98, the vacuum switch 100 and the heat switch 104. With the vacuum switch 100 on and the trigger 28 released, an operator takes the tool by the handle portion 16 and picks up a Z-clip 74 with the tip 24 of the barrel assembly 18. The suction of the vacuum through the opening 62 holds the Z-clip 74 onto the tip 24 of the barrel 22. The Z-clip 74 is then pushed on and bottomed over the appropriate wire wrap pin 64. The insertion of the pin 64 into the longitudinal axial bore 41 acts to align the tip 24 and the clip 74 with the pin 64. The operator then pulls the trigger 28 to simultaneously initiate heating of the tip 24 and shutting off suction through the axial opening 62. When the temperature alarm light 30 comes on indicating that the tip 24 has reached operating temperature, the operator applies solder to the Z-clip 74. After the solder flows, the tool 10 is pulled clear of the circuit board 66. Once the tool 10 is clear of the circuit board 66, the trigger 28 is released, which brings a vacuum back on and allows the sequence to be repeated. When done by a skilled operator, the total time for the above sequence is approximately 10 seconds.

As described above, the tool 10 may be applied to the circuit board 66 by selecting the wire-wrap pin 64 visually and then applying the tool 10 manually. Alternatively, the tool 10 may be used in conjunction with a numerically controlled machine. The machine is programmed to position the appropriate pin 64 in front of a site 134, as illustrated in FIG. 1. The tool 10 is then placed in the site 134 and the Z-clip 74 is pushed on over the pin 64 and soldered in place. The barrel 22 has a curved shape to permit rotation of the tool 10 in the sight 134 to align the square-shaped opening in the Z-clip 74 with the square-shaped pin 64.

FIG. 6 illustrates an alternative embodiment of the barrel assembly 18. The design illustrated here incorporates a removable tip assembly 136. This tip assembly 136 is designed to have the same configuration as before to facilitate use with the Z-clip 74. The tip assembly 136 consists of a metallic conductor 138 that is machined to fit the outline of the Z-clip 74, a sheathed thermocouple probe 140 that is brazed to the end of the conductor 138 and terminates in two miniature male thermocouple connectors 142. The connectors 142 are potted within a thermoplastic premold 144 and an epoxy final mold 146. The tip is attached by fasteners (not shown) to the barrel 148. The barrel 148 includes two miniature female thermocouple connectors 150 potted within a thermoplastic premold 152 and an epoxy final mold 154 to connect to the male thermocouple collectors 142. The barrel 148 also includes conductors (not shown) potted in the epoxy 154 to carry current to and from the tip assembly 136. The barrel 148 and the tip assembly 136 have an axial bore to carry suction to the tip. The tip assembly 136 is sealed to the barrel 148 to maintain negative and positive air pressure at the tip. The removable tip 136 is substantially identical to the other features of the first tip 24 and barrel 22 of the barrel assembly 18 previously described. In the eventuality solder is sucked into the tip, the removable tip 136 facilitates cleaning without having to disassemble the entire tool 10. In addition, the removable tip assembly 136 allows use of the tool 10 in soldering any number of connecting clip styles, using the same gun and barrel, and without having to disassemble the entire gun.

As will be readily appreciated from the foregoing description, the invention provides a hand-held vacuum pickup tool with an integrally heated soldering tip for use in rapidly installing connector clips on wire-wrap pins. The tool holds connector clips in a manner that allows placement on the proper wire wrap pin at any angle that the wire wrap pins will allow. In addition, the tool may be used in conjunction with a programmed numerical control machine. Furthermore, by virtue of the temperature controller, the tool provides the proper heat for soldering the connector clips to the wire wrap pin and circuit board. Thus, an operator can control the heating characteristics of the tool by varying the process temperature set point and the alarm temperature set point of the temperature controller.

Because heat is applied only on demand, power consumption is reduced and, if the tool sits for any length of time, the continuous suction of air through the tip and the high thermal conductivity of the barrel provide for rapid cool-down, thus reducing the hazard of burns and reducing power consumption. The electrical isolation of the tip and the low voltage used (3 volts across the tip) prevents the hazard of electrical shock while the high current flowing through it (approximately 100 amps) provides for rapid heating (approximately 2-3 seconds), making it amenable for use in a high-production environment. Furthermore, the timer allows compliance with any assembly specifications regarding time at a certain temperature.

Finally, by permitting adjustment in the amount of suction, an operator may reduce the suction to a minimum required for picking up the style of clip in use while keeping objectionable noise to a minimum. Thus, the tool enables quick and reliable placement and soldering of a connector clip in one motion as compared to first placing the clip on a wire wrap pin with tweezers or pliers and then secondarily soldering with an iron.

While a preferred embodiment of the invention has been illustrated and described, it is to be understood that within the scope of the appended claims various changes can be made therein without departing from the invention. For instance, the temperature controller 114 may comprise a simple on-off control or may include a temperature gauge and a variable adjustment in the final temperature to which the tip is allowed to reach.

The embodiments of the invention in which an exclusive property or privilege is claimed are defined as follows:

1. A hand-held tool for picking up and soldering a connector clip onto a wire wrap pin, the tool comprising:
   a handle;
   a barrel mounted to the handle, the barrel having a tip;
   means for holding the connector clip to the tip using a vacuum; and,
   means for heating the tip to effect soldering of the connector clip to the pin.

2. The tool of claim 1, further comprising means for selectively activating the heating means.

3. The tool of claim 2, wherein the activating means comprises a switch mounted in the handle.

4. The tool of claim 3, wherein the switch simultaneously deactivates the means for holding when the heating means is activated, thereby releasing the connector clip from the tip.

5. The tool of claim 2, wherein the means for holding comprises a longitudinal bore extending through the barrel and the tip, and a vacuum source coupled to the barrel such that a vacuum applied to the bore of the barrel creates a suction at the tip of the barrel to thereby hold a connector clip to the tip.

6. The tool of claim 5, wherein the longitudinal bore is sized to receive the wire wrapped pin as the connector clip is placed over the pin to thereby align and the connector clip with the pin.

7. The tool of claim 2, wherein the heating means comprises an electrically resistive heating element integrally formed with the tip of the barrel.

8. The tool of claim 5, further comprising means for removing solder from the longitudinal bore when the tip is heated.

9. The tool of claim 8, wherein the solder removing means comprises a valve means for selectively admitting pressurized air to the barrel to thereby eject solder from the tip of the barrel.

10. A hand-held tool for picking up and soldering a connector clip onto a wire wrap pin, the tool comprising:
- a body, the body including a handle portion;
- a barrel having a mounting end mounted to the body and a protruding end protruding from the body, the protruding end having a tip;
- a longitudinal axial bore in the barrel opening to the mounting end and the protruding end, the opening in the mounting end being coupled to an air source;
- a first opening in the tip for connecting to the opening in the protruding end of the barrel;
- means for selectively holding the connector clip to the tip comprising a second opening in the tip that communicates with the first opening such that a vacuum applied by the air source creates a suction at the second opening whereby a connector clip placed over the second opening is held in place on the tip, the second being sized and shaped to receive the pin as the connector clip is placed over the pin, to thereby align the tip and the connector clip with the pin; and,
- means for heating the tip to effect soldering of the connector clip to the pin.

11. The tool of claim 10, wherein the tip has a step projecting therefrom that is sized to hold a Z-shaped connector clip.

12. The tool of claim 11, further comprising a trigger means for selectively activating the heating means and simultaneously deactivating the vacuum applied to the first opening.

13. The tool of claim 12, wherein the tip includes a thermocouple for monitoring the temperature of the tip when the heating means is activated.

14. The tool of claim 13, further comprising means for removing solder from the tip when the tip is heated.

15. The tool of claim 14, wherein the solder removing means comprises a valve means coupled to the air source for selectively admitting pressurized air to the longitudinal bore to thereby eject solder from the second opening in the tip 16. The tool of claim 14, wherein the tip is removable from the barrel.

* * * * *

UNITED STATES PATENT AND TRADEMARK OFFICE
CERTIFICATE OF CORRECTION

PATENT NO. : 4,965,433

DATED : October 23, 1990

INVENTOR(S) : Kurt F. Hanke et al

It is certified that error appears in the above-identified patent and that said Letters Patent is hereby corrected as shown below:

Column 8, line 2, after the word "second" insert the word --opening--.

Signed and Sealed this

Third Day of March, 1992

Attest:

HARRY F. MANBECK, JR.

Attesting Officer

Commissioner of Patents and Trademarks